United States Patent [19]

Dobkin

[11] 4,239,986
[45] Dec. 16, 1980

[54] POWER CONTROL ARRANGEMENT AND CONTROL CIRCUIT ESPECIALLY SUITABLE FOR USE THEREWITH

[75] Inventor: Robert C. Dobkin, Hillsborough, Calif.

[73] Assignee: Hyrbrinetics, Inc., Santa Rosa, Calif.

[21] Appl. No.: 940,733

[22] Filed: Sep. 8, 1978

[51] Int. Cl.³ .......................................... H03K 17/72
[52] U.S. Cl. ........................ 307/252 B; 307/252 N; 307/252 W; 307/310; 323/34; 323/45
[58] Field of Search ........ 307/252 B, 252 N, 252 VA, 307/252 W, 362, 310; 323/34, 45

[56] References Cited

U.S. PATENT DOCUMENTS

| | | | |
|---|---|---|---|
| 3,648,077 | 3/1972 | Evalds | 307/252 B |
| 3,708,696 | 1/1973 | Lorenz | 307/252 B |
| 3,739,198 | 6/1973 | Clements | 307/252 B |
| 3,900,763 | 8/1975 | Turner | 307/252 B |
| 4,031,458 | 6/1977 | Ichikawa | 307/252 B |

Primary Examiner—John Zazworsky
Attorney, Agent, or Firm—Flehr, Hohbach, Test

[57] ABSTRACT

An arrangement for controlling power during any given half cycle of AC power is disclosed herein and includes a gated switching device connected across an AC voltage supply, and a charging capacitor also connected with the supply voltage and adapted to discharge into the gate of the switching device for firing the latter under predetermined, externally controlled conditions. A low voltage control circuit is also disclosed herein and is especially suitable for use with the switch arrangement just recited, specifically for causing the capacitor to discharge at a particular point during a particular half cycle in the AC voltage supply.

24 Claims, 11 Drawing Figures

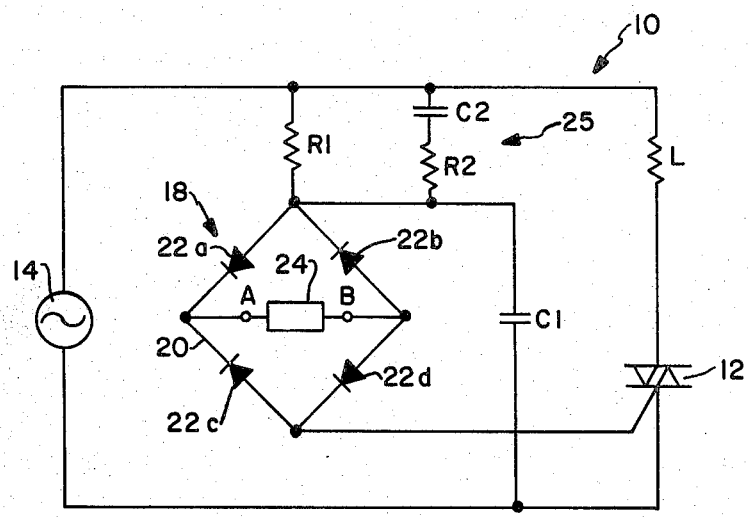
FIG.—1
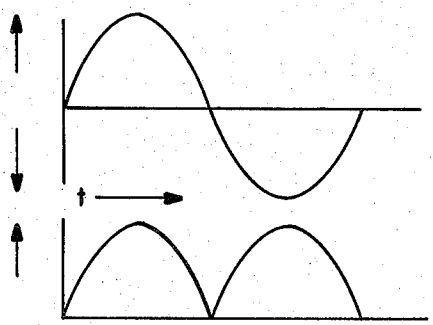
FIG.—2a
FIG.—2b
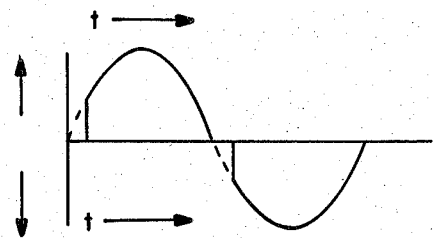
FIG.—2c
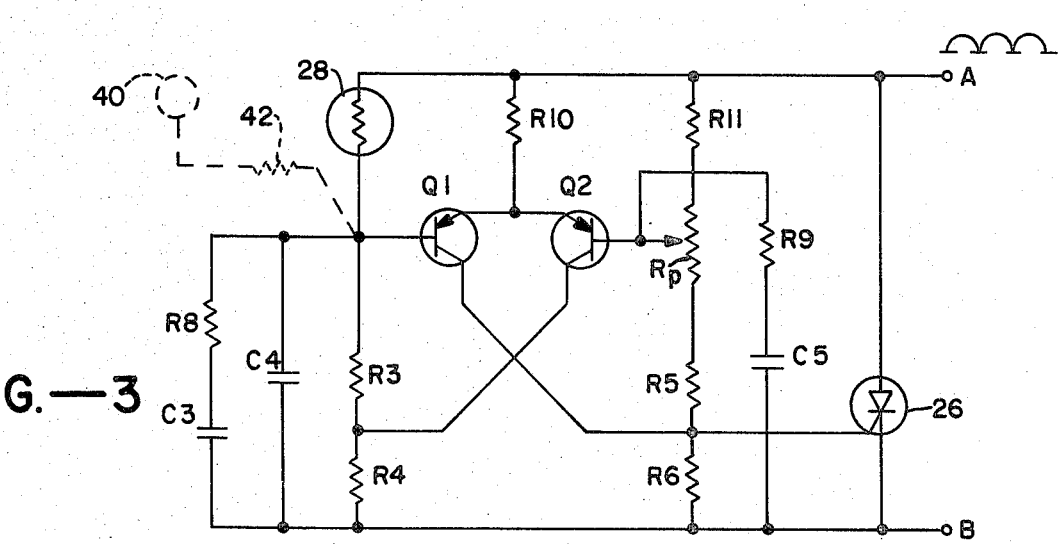
FIG.—3

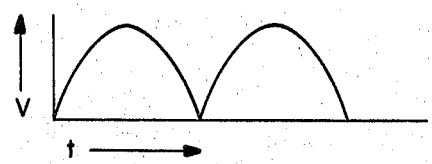
FIG.—4a
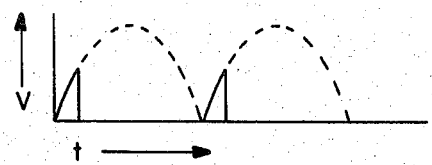
FIG.—4b
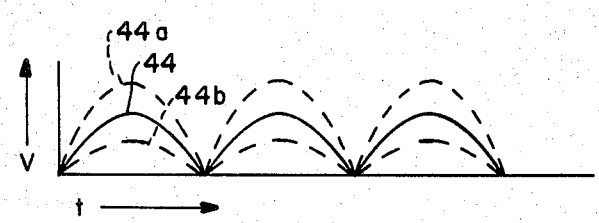
FIG.—5a
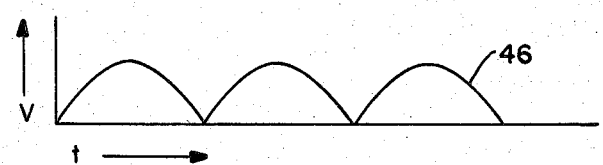
FIG.—5b
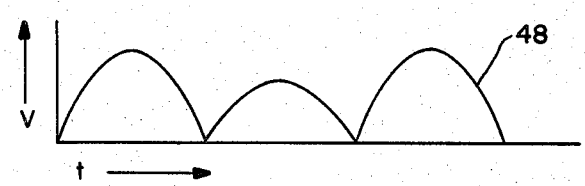
FIG.—5c
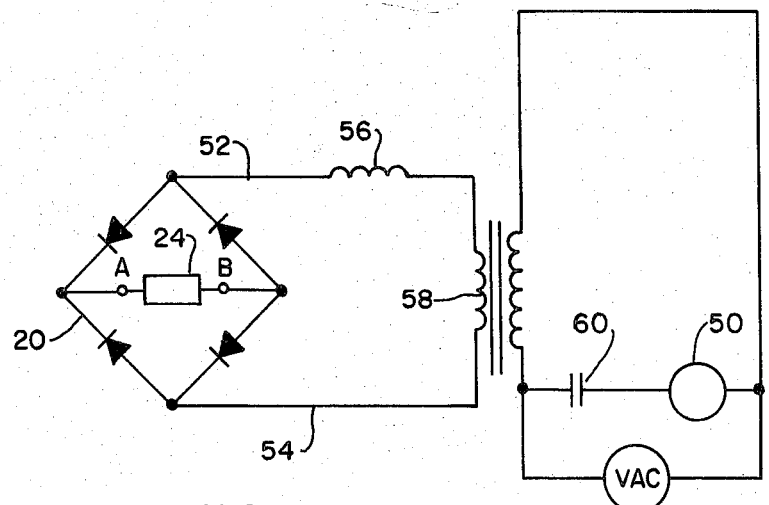
FIG.—6

POWER CONTROL ARRANGEMENT AND CONTROL CIRCUIT ESPECIALLY SUITABLE FOR USE THEREWITH

BACKGROUND OF THE INVENTION

The present invention relates generally to power control circuits and more particularly to a specific type of switch power control arrangement which is adapted for operation on relatively high AC voltage and a specific condition responsive, low voltage control circuit which is especially suitable for use with this control arrangement.

There are many different ways of controlling AC power presently available in the marketplace. These different ways have varying advantages and disadvantages relative to one another, depending upon their intended use. Many include circuits which are condition responsive, that is, their operation depends upon the state of a particular condition being monitored, such as temperature, and it is most probable that many of these circuits are capable of operating a high and/or low voltage.

As will be seen hereinafter, the present invention is directed to a particular power control arrangement including an output switch which is adapted to operate on relatively high AC voltage to switch during selected half cycles of the AC volatage and a condition responsive circuit which is provide for controlling the switch and which operates on relatively low voltage. The various advantages of this particular arrangement, generally, and the control circuit specifically will be discussed hereinafter. For the moment, it suffices to say that this control arrangement including its control circuit has a number of distinct advantages and yet it is uncomplicated in design and reliable in use, as will become apparent hereinafter.

OBJECTS AND SUMMARY OF THE INVENTION

One object of the present invention is to provide a power control arrangement including a gated switching device which operates on and is controlled by a relatively high voltage while at the same time utilizing a relatively low voltage circuit for controlling the switching device.

Another object of the present invention is to provide a control circuit which turns the gated switching device on at relatively low voltage when the switching device is operating on AC voltage, the turn on point during a given half cycle being provided when the voltage is moving away from zero but preferably as close to zero as possible, which minimizes RF interference that might otherwise be generated by switching at relatively high voltage, thereby maximizing the power to the load.

Still another object of the present invention is to provide the condition responsive control circuit apart from the control arrangement just recited, and particularly one which operates at a limited voltage level below the voltage applied to its input.

Yet another object of the present invention is to add a certain amount of hysteresis to the control circuit just recited so as to minimize if not eliminate erratic operation within the circuit caused by to slight variations in the condition being monitored.

Still another object of the present is to provide a control circuit which operates on rectified AC voltage and which latches into one of two operating modes during any given half cycle only at a time during the half cycle when the voltage is rising.

Yet another object of the present invention is to provide a control circuit which operates in a particular one of two operating modes in proportion to the particular state of the condition being monitored compared to a particular reference value.

The foregoing has been a summary of a number of objects which are attained by the overall power control arrangement and its control circuit as disclosed herein. The particulars necessary in attaining these objects will be discussed in detail hereinafter, at which time other objects and features of the present invention will become apparent. For the moment it suffices to state that the control arrangement of the present invention includes a gated switching device and a charging capacitor, both of which are connected to an AC voltage supply. This arrangement also includes control means connected with the voltage supply and connecting the capacitor to the gate of the switching device under predetermined conditions to initiate discharge of the capacitor into the gate for producing a sufficiently large current pulse to fire the device and cause it to conduct during a given half cycle of the AC voltage supply. While the control circuit is connected to the voltage supply, as just stated, it operates on a relatively lower voltage and, hence, the arrangement includes appropriate voltage reducing means.

The control circuit itself, in accordance with the present invention, includes means for providing a rectified AC voltage to a predetermined point, a switch and an external condition responsive control network. The switch is connected to the supply means at the predetermined point just recited for closing a circuit from that point to a second reference point when the switching device is activated. The control network includes switching means connected with the supply means and the switch and latching into one of two operating modes during a given half cycle of the rectified AC voltage for either actuating the switch or maintaining it in a deactuated state, depending upon the particular condition being monitored. This switching means initially latches into one of the two modes, during the given half cycle, at a fixed voltage level, preferably below the peak voltage of the half cycle.

BRIEF DESCRIPTION OF THE DRAWINGS

FIG. 1 is a schematic illustration of a power control arrangement constructed in accordance with the present invention.

FIG. 2a is a graphic illustration of the input voltage to the arrangement illustrated in FIG. 1.

FIG. 2b is a graphic illustration of the voltage input to the control circuit comprising part of the switch arrangement illustrated in FIG. 1.

FIG. 2c is a graphic illustration of how the voltage may appear at the output of the switch arrangement of FIG. 1.

FIG. 3 is a schematic illustration of the control circuit which is constructed in accordance with the present invention and which is especially suitable for use with the arrangement illustrated in FIG. 1.

FIG. 4a is a graphic illustration of the input voltage to the circuit illustrated in FIG. 3.

FIG. 4b is a graphic illustration of what the voltage might look like at the output of the circuit illustrated in FIG. 3.

FIGS. 5a, b and c are graphic illustrations of voltage at various points in the circuit of FIG. 3.

FIG. 6 is a schematic illustration of a furnace relay circuit using the circuit of FIG. 3.

DETAILED DESCRIPTION AND PREFERRED EMBODIMENTS

Turning now to the drawings, wherein like components are designated by like reference numerals throughout the various figures, a power control switching arrangement designed in accordance with the present invention is illustrated and generally designated by the reference numeral 10. As seen in FIG. 1, arrangement 10 includes a gate switching device 12, specifically a triac in the embodiment illustrated, which is connected across a cycling voltage supply, preferably an AC voltage supply 14 and in series with the load generally indicated by the resistance L. As will be discussed in more detail hereinafter, the triac is triggered by a charging capacitor C1 which is also connected with the voltage supply.

Power control switch arrangement 10 also includes a control network generally designated at 18 connected with the voltage supply and, as will be seen below, provided for connecting the capacitor C1 to the gate of triac 12 under predetermined conditions. This initiates discharge of the capacitor into the gate for producing a sufficiently large current pulse to fire the triac and cause it to conduct during a given half cycle of the AC voltage supply. This control network includes a full wave bridge rectifier 20 made up of four diodes 22 for converting the AC voltage to full wave rectified AC voltage (See FIG. 2b) and a control circuit 24 which will be discussed in detail with respect to FIG. 3. For the moment, it is only necessary to state that control circuit 24 shorts the two terminals generally designated at A and B together under predetermined conditions and otherwise maintains a high impedance circuit therebetween.

In addition to the various components thus far recited, arrangement 10 includes a resistor R1 which is provided for reducing voltage applied to the input of network 18, that is, to the input of bridge 20 and the network 25 comprised of the resistor R2 and series connected capacitor C2 which, for reasons to be discussed hereinafter, connects the voltage supply to the control network in phase leading relationship compared to that of triac 12.

As will be seen hereinafter, arrangement 10 is provided for driving load L with high voltage through triac 12 during the period or periods when the latter conducts current. In a preferred embodiment, the voltage applied across the triac and load from supply 14 is 110 volt AC voltage as illustrated in FIG. 2a or it may be 200 volt AC or 12 V. voltage. However, it is to be understood that the switch arrangement is not limited to these particular voltage levels or waveforms, so long as the voltage supply is cyclic.

As stated previously, triac 12 is triggered by capacitor C1 which, in turn, is controlled by means of network 18. More specifically, so long as control circuit 24 maintains the circuit between points A and B at high resistance insufficient current drives the triac to turn it on. However, during any given half cycle of voltage from supply 14, control circuit 24 may short together the terminals A and B in response to a particular condition, actually an input parameter such as temperature or light or voltage. By shorting together points A and B, control circuit 24 provides a low impedance path of discharge from capacitor C1 to the gate of triac 12 through two of the diodes making up bridge 20, specifically diodes 22a and 22d or 22b and 22c, depending upon the voltage polarity, and through the control circuit itself. As a result, the capacitor discharges, providing a high current pulse to trigger the triac at some point during the given half cycle. Of course, by its very nature, the triac once triggered will stay on until the voltage across it reduces to zero, that is, until the beginning of the next half cycle, when it will turn off until receiving another pulse at its gate. In accordance with one aspect of the present invention, control network 18 operates on relatively low voltage even though the triac operates on substantially higher voltage and even through it requires a relatively high current pulse to be triggered into conduction. In one embodiment, the resistance value of R1 is 20K ohms, thereby reducing the peak value supplied to bridge 20 accordingly.

In accordance with another aspect of the present invention, control circuit 24 when initiating discharge of capacitor C1 during a given half cycle for firing triac 12 includes means for doing this at a time during the given half cycle when the voltage is moving away from zero. This, of course, only occurs during the first quarter cycle and third quarter cycle illustrated in FIG. 2a. In this way, the triac is on for at least a quarter cycle before the supply voltage moves back to zero and the triac turns off. Moreover, network 25 which, as stated, provides a phase lead to the control network, causes the firing point of the triac to be closer to zero than would be the case without this network. FIG. 2c illustrates two successive half cycles where the triac is caused to fire and hence conduct at a point on each half cycle when the voltage is going away from zero but relatively close thereto. By actuating the triac at low voltages, specifically as close to zero as possible, RF interference otherwise generated by switching high voltages is minimized even though the triac operates on high voltage. Additionally this provides optimum polarity of gating pulses to the triac.

Having described circuit arrangement 10, attention is directed specifically to control circuit 24 which, as stated, is illustrated in detail in FIG. 3. As also stated, this circuit operates on full wave rectified AC voltage through bridge 20 comprising part of the overall control network. Two half cycles of this full wave rectified voltage is illustrated in FIG. 4a. The control circuit includes a gated unidirectional switching device, specifically a silicon controlled rectifier (SCR) 26 in the embodiment illustrated, which is connected across previously recited terminals A and B and, when fired, operates to short these two points together.

As stated previously, terminal points A and B are shorted together in response to the existence of a predetermined condition or input parameter. As a result, circuit 24 includes means for producing a first control signal, actually voltage, having an amplitude ratio dependent upon the particular condition and a second reference signal having a fixed ratio to the input power. Amplitude ratio is important because the voltage providing means for producing both signals operates on rectified AC voltage varying between zero and a peak value. In the embodiment illustrated, a thermisor 28 is provided for producing the control signal and a variable resistor Rρ, actually a potentiometer in conjunction with fixed resistor R11, is provided for producing the reference signal.

In order to control SCR 26 in response to the voltage signal developed across the thermistor as compared to the reference signal developed across the potentiometer, arrangement 24 includes two PNP transistors, Q1 and Q2, having their emitters connected together and to the voltage supply through the current setting resistor R10. The base of transistor Q1 is connected to thermistor 28 and the base of transistor Q2 is connected to potentiometer Rp, as illustrated. Moreover, the two transistors are interconnected to one another in a symmetrical, positive feedback relationship through the base and collector of each by means of resistors R3 and R4 associated with the transistor Q1 and resistors R5 and R6 associated with transistor Q2. As illustrated in FIG. 3, transistor Q1 directs the current through resistor R10 to the gate of SCR 26 whereas transistor Q2 is connected to bypass current away from the gate of the SCR. For reasons to be discussed hereinafter, circuit arrangement 24 also includes capacitor C3 and series connected resistor R8 for providing hysterisis to the circuit and capacitor C4 for controlling the firing time of SCR 26 during any particular half cycle that it fires. In addition, the capacitor C5 and series connected resistor R9 provide a certain degree of negative feedback to the circuit for operating it in a particular mode to be described.

Having described circuit 24 structurally, attention is now directed to the manner in which it operates. It should be evident that this control circuit is a two wire device which, because of thermistor 28, is responsive to temperature. It should be equally evident that the circuit could be made responsive to other input parameters by replacing the thermistor with a different type of resistance variable element, for example, a photocell. In any event, as stated previously, the purpose of this circuit is to short together points A and B. If the control circuit makes a decision not to short together these points during any given half cycle, only a small amount of operating current is drawn therebetween. On the other hand, if the circuit makes a decision to short together points A and B by causing the SCR to conduct, the voltage at point A drops significantly, specifically, to the operating level of the SCR.

One important aspect of circuit 24 is that even at high voltage, that is, the peak voltage at point A during any given half cycle, the circuit remains latched into whatever condition is latched into at a low voltage in the beginning of the half cycle. More specifically, as the voltage increases during any given half cycle of the supply, the circuit makes a decision whether or not to turn on SCR 26 and it remains latched into that decision for the rest of the half cycle. This is because transistors Q1 and Q2 are current dependent. The gain of the circuit increases with the supply voltage because the current through the circuit is increasing. It reaches some value of gain and then, because the transistors are interconnected in a positive feedback relationship, the circuit latches into either the "on" or the "off" states, that is, either transistor Q1 turns on while transistor Q2 is off (on state) or transistor Q2 turns on while transistor Q1 is off (off state).

In order to explain the latching operation further, let it be assumed that transistor Q2 is turning on. This would generate a positive going voltage across resistor R4. This positive voltage across resistor R4 goes through resistor R3 to the base of transistor Q1 causing the base of the latter to go more positive. As the base of the transistor Q1 goes more positive, its emitter also goes more positive, also causing more current to flow into the emitter of Q2. As this occurs, the current at the collector of transistor Q2 increases, generating an even more positive voltage across resistor R4. While these transistors do not generally reach saturation, they do latch into the condition they are in, requiring an extremely large signal to unlatch them. Note that with transistor Q2 on and transistor Q1 off, current from the voltage supply is bypassed away from the gate of SCR 26 so that the latter remains nonconductive.

Having described the latching effect of the two transistors as a result of their positive feedback relationship, attention is now directed to the particular way in which the circuit decides which transistor to turn on and when it is to turn on. At any given half cycle, as the voltage arises from zero, the circuit begins to make the decision based on thermistor 28. More specifically, the unbalance between the control signal across the thermistor and the reference signal across the potentiometer Rp determines whether transistor Q1 or transistor Q2 turns on. The effect of transistor Q2 turning on was described previously. If on the other hand the control signal and reference signal are such that transistor Q1 turns on, this provides a positive feedback because a voltage is generated across resistor R6 which is translated up through resistor R5. This in turn makes the emitter of transistor Q2 more positive and more current goes into the emitter of transistor Q1 and hence an even larger voltage appears across resistor R6, thereby latching the circuit into this on slate.

With transistor Q1 on and transistor Q2 off, current is supplied through transistor Q1 to resistor R6 and to the gate of SCR 26. When this signal reaches about 0.6 volts between the gate and cathode of the SCR, the latter fires. This shorts points A and B causing the voltage at point A to drop to the conduction potential of the SCR which is about 0.9 volts. The SCR will remain on until the voltage across it drops to zero, that is, until the beginning of the next half cycle.

Another important aspect of circuit 24 is the addition of hysteresis. This is desirable so as to avoid erratic operation caused by the SCR firing one half cycle and not the next, and then firing for several half cycles and then not firing at all, when the circuit is very close to the firing point, thereby producing a chatter in the circuit. To eliminate this, a form of memory is added to the circuit so that the latter remembers what it did during a number of previous half cycles. This is accomplished by storing a voltage on capacitor C3. Resistor R8 provides a controlled amount of current to this capacitor. For example, let it be assumed that the circuit is in its off state, there is, the SCR is not conducting. In this state, capacitor C3 will slowly charge up to the potential at the base of transistor Q1 and be averaged over a plurality of half cycles. Should the SCR fire during a given half cycle, the voltage across the circuit collapses for that half cycle and stays collapsed so long as the circuit continues to maintain the SCR in a conductive state. The average value of the voltage at capacitor C3 now decreases because the average value of voltage to the circuit (at point A) has been reduced significantly, specifically to 0.9 volts across the SCR. Accordingly, the average value stored in the capacitor is much lower.

The voltage stored in capacitor C3 is in a direction through resistor R8 to pre-bias the base of transistor Q1 so as to make the transistor continue to operate in the mode that it is in at that time. For example, let it be assumed that the transistor is off and has been for a number of half cycles which means that transistor Q2 is on and voltage is being developed across resistor R4. Moreover, the SCR is off and the voltage across capacitor C3 is high which makes the voltage at the base of transistor Q1 high, which is exactly which is needed to maintain this transistor in its off state. On the other hand, if this particular transistor were on for a number of previous half cycles, the SCR would have been firing and the voltage stored in capacitor C3 would be low tending to pull the base of transistor Q1 down which is exactly what is required to maintain the transistor in an on state. As a result, the chatter discussed previously is minimized, if not eliminated.

Still another important aspect of circuit 24 resides in the firing time of SCR 26 during any given half cycle, once the circuit establishes it will fire at all during that half cycle. More specifically, it is desirable that the SCR fires only on the rising edge of a given half cycle, since if it fires on the falling edge, the SCR conducts for less than a quarter cycle, thereby producing unwanted short, rather sharp spikes across the terminals A and B. In order to assure that the SCR fires only on the rising edge of a half cycle, if it fires at all, capacitor C4 provides a small phase lead to the base of transistor Q1. This is best illustrated in FIG. 4b which shows what the output voltage might be across the SCR during any consecutive half cycles. Note that the SCR only fires on the rising side of each half cycle as indicated by solid lines.

Another important aspect of the present invention resides in the ability of the circuit to provide what may be referred to as "pulse proportional control" rather than on-off control of the SCR. Pulse proportional control is where the true power is turned on, that is, where the SCR is conducting in circuit 24, in proportion to the amount of error (difference) between the control voltage, that is, the voltage across the thermistor 28, and the reference voltage. For example, in circuit 24, if the temperature being sensed remains at a relatively fixed value for a period of time, the SCR will remain on for a period of time proportionate to the difference between control voltage and reference voltage so as to provide a certain percentage of available power to the load being driven. One example where this type of a control is desirable is where the circuit is used as part of a thermostat in controlling temperature of an object. It may take an hour or two for the temperature of that object to change by even a few degrees.

The network consisting of capacitor C5 and series connected resistor R9 adds pulse proportional control to circuit 24. However, to accomplish this, the capacitor C5 is or should normally be very large in value, for example in the order of 1 microfarad, and resistor R9 should also be large, on the order of 4 M ohms. This network opposes the positive feedback inherently supplied by capacitor C3 and resistor R8 with a different time constant. Operationally, let it be assumed that circuit 24 is initially turned on transistor Q1. In this state, the voltage on capacitor C5 begins to increase since the voltage across resistor R9 increases. As the average voltage on this capacitor increases, the voltage at the base of transistor Q2 increases, mainaining the transistor in an off state. Since circuit 24 is now on, the SCR fires and the voltage on capacitor C5 begins to decrease, discharging through resistor R9 since the average value across the supply is a lot lower. As the voltage at capacitor C5 decreases, the base at transistor Q2 is pulled negative, thereby tending to turn transistor Q2 on which, in turn, causes transistor Q1 to turn off. The two transistors will cycle back and forth turning on and off this way with the on and off time being proportionate to the difference (error) in control voltage and reference voltage. The necessary condition to accomplish this is that the negative feedback provided by the C5-R9 network combination be greater than the positive feedback of the C3-R8 combination, which means that the value of resistor R9 has to be less than the value of R8. Moreover, the time constant of capacitor C5 should be much longer than the time constant of capacitor C3. Typically, the value of capacitor C3 would be in the order of 0.01 microfarads whereas C5 would be several microfarads.

In addition to the foregoing, control circuit 24 can be readily modified to include a three level power output in conjunction with either proportional control or on-off control. Three level operation is where each half wave is fired independently as more power is called for by the load. More specifically, starting from a zero power position, no voltage is applied to the load. However, assume at the next half cycle of the full AC cycle being applied to the load, the control circuit turns on power to the load, that is, the SCR 26 conducts, and also on the next half cycle. As the means supplies power to the load, it first supplies fifty percent of the full cycle (the total half cycle) and then it supples the other fifty percent, thereby supplying a full one hundred percent. This is an essentially three step control rather than merely a power on, power off situation. More specifically, there can be for example a half power setting.

In circuit 24 this is accomplished by supplying an AC input signal indicated in phantom lines at 40 to the base of either transistor Q1 or Q2 (it does not matter which) through a fixed resistor indicated by phantom lines at 42. On one half of the AC input cycle, the voltage across resistor 42 is positive with respect to terminal B. On the other half of the AC input cycle, the voltage across resistor 42 is negative with respect to terminal B. This provides a voltage at the base of transistor Q1 (or Q2) which is more positive on the one half cycle than on the other. Accordingly, transistor Q1 is predisposed to turn on or off more easily when the voltage across the resistor 42 is negative than when it is positive. Under these circumstances, the thermistor 28 goes through its set points, transistor Q1 will first turn on during the negative half cycle and as the thermistor goes further from the set point it will turn on during the positive half cycle.

For a better understanding of this, attention is directed to FIGS. 5a, 5b and 5c. FIG. 5a shows the voltage at the base of transistor Q1 under normal conditions, that is, without an AC signal. This is indicated at 44. On the same scale, as the voltage across the thermistor increases as a result of an increase in temperature, the base of transistor Q1 will increase, as indicated by dotted lines at 44a. On the other hand, should the thermistor decrease in temperature, the voltage at the base of transistor Q1 will decrease to the level indicated by dotted lines at 44b. FIG. 5b represents the voltage at the base of transistor Q2 as set by potentiometer Rp and hence remains constant under all conditions, as indicated at 46.

When the voltage at the base of transistor Q1 is more positive than the voltage at the base of transistor Q2, the circuitry does not fire the SCR. Accordingly, it can be seen that when the voltage at the base of transistor Q1 is the voltage 44a illustrated in FIG. 5a, compared to the reference voltage 46 illustrated in FIG. 5b, the SCR does not fire. On the other hand, it does fire when the control voltage is that indicated at 44b. Now, when the AC voltage signal from supply 40, which is at the same frequency as voltage 49, is added to the base of transistor Q1 across resistor 42, the voltage at the base may look like that illustrated at FIG. 5c with some degree of exaggeration for purposes of illustration. The newly added voltage will either add to or subtract from voltage 44 (or 44a or 44b). Accordingly, the control voltage is continuously changing on a time proportioning basis. By controlling this particular newly added signal, specifically its amplitude as compared to the control signal, the firing of SCR 26 can be further controlled. For example, in FIG. 5c, note that during the first half cycle the SCR will not fire whereas it does in the second half cycle and so on.

Having described control circuit 24, its method of operation, as well as a number of specific aspects, attention is now directed to one particular way in which the circuit can be utilized. Specifically, as illustrated in FIG. 6, the circuit and its associated full wave bridge act as a thermostat for operating as a remote 2 wire thermostat for a household furnace motor indicated generally at 50. To accomplish this, the two wires indicated at 52 and 54 from the bridge may merely be connected into the furnace relay coil which is indicated at 56. Typically, this relay receives power from the main line supply through a step down transformer indicated at 58. The relay includes a normally open contact 60 in series with the furnace motor and main power supply. In operation, so long as control circuit 24 maintains the terminals A and B open, low current can pass through the relay coil and hence it remains deenergized. However, when circuit 24 fires its SCR 26, the two terminals A and B short closing the circuit including relay 56, thereby causing the latter to energize. This in turn closes contact 60 for energizing motor 50. This particular use of circuit 24 and its method of use described in FIG. 1 are of course only two of many ways to utilize circuit 24.

Having describec circuit 24 and its operation, it is to be noted that this circuit is easily adapted to operate with an external set point control. More specifically, means including for example a timer, external resistance network and switch may be connected with these resistors affecting the set point. The switch can be used to connect the resistance network in circuit with the existing resistors or in lieu thereof, thereby changing the reference signal at a predetermined time or manually.

What is claimed is:
1. A power control circuit, comprising:
   (a) a cycling voltage supply adapted to supply power to a load;
   (b) a gated switching device adapted to pass current in at least one of two opposite directions, said switching device and load being connected across said voltage supply;
   (c) a capacitor connected with said voltage supply so as to be charged thereby;
   (d) control means connected with said voltage supply and connecting said capacitor to the gate of said switching device under predetermined conditions to initiate discharge of said capacitor into said gate for producing a sufficiently large current pulse to actuate said device and cause it to conduct during a given cycle of said voltage supply said control means including means for initiating discharge of said capacitor for causing said switching device to conduct only at a time during said given cycle when the voltage is moving away from zero;
   (e) means for reducing the voltage supplied to said control means for operation thereof; and
   (f) means connecting said voltage supply to said control means in phase leading relationship compared to that of said switching device for causing said control means to initiate discharge of said capacitor for causing said switching device a conduct closer to zero voltage during said given cycle.

2. A circuit according to claim 1 wherein said switching device is a bidirectional switch.

3. A circuit according to claim 1 wherein said cycling voltage supply is an AC voltage supply, said given cycle being half of a full AC cycle.

4. A circuit according to claim 1 wherein said voltage reducing means includes a resistor connected between said voltage supply and said control means.

5. A circuit according claim 1 wherein said voltage supply connecting means includes a capacitor and resistor which are connected in series with one another between said voltage supply and control means and which are of predetermined values.

6. A circuit according to claim 1 including means for rectifying said cycling voltage connecting said control means with said voltage supply whereby to provide rectified voltage to said control means from said supply and wherein said rectifying means and control means are connected between the discharge side of said capacitor and switching device gate.

7. A control switch arrangement, comprising:
   (a) supply means for providing rectified AC voltage to a predetermined point;
   (b) a switching device connected to said predetermined point for closing a circuit from said point to a second reference point when said switching device is actuated; and
   (c) an external condition responsive control circuit including switching means connected with said supply means and said switching device and latching into one of two operating modes during a given half cycle of said rectified AC voltage, for either actuating said switching device or maintaining it in a deactuated state, depending upon the particular condition being monitored, said switching means initially latching into one of said modes during said given half cycle of said rectified AC voltage at a predetermined, fixed voltage level of said half cycle, said control circuit also including means for producing a mode biasing voltage during said given half cycle, said voltage having a maximum amplitude dependent upon the number of times said switching device was in its actuated or deactuated state over a plurality of half cycles immdiately prior to said given half cycle whereby to bias said switching means towards one of said modes of operation depending upon the amplitude of said mode biasing voltage.

8. A control switch arrangement according to claim 7 wherein said predetermined, fixed voltage level is below the peak voltage of said half cycle.

9. A control switch according to claim 7 wherein said control circuit includes means for causing said switching means to initially latch into one of said modes during any given half cycle only at a time during said half cycle when said voltage is rising.

10. A control switch according to claim 7 including means for producing a condition responsive signal having an amplitude ratio dependent upon said condition and a reference signal having a fixed amplitude ratio, said switching means being connected with said signal producing means and initially latching into one of said modes depending upon the amplitude ratio of said condition dependent signal relative to the amplitude ratio of said reference signal.

11. A control switch according to claim 10 wherein said control circuit includes means for cooperating with said switching means and responsive to said condition dependent signal and said reference signal for varying the amount of time said switching means operates in either of said two modes over a period of time, depending upon the difference between said signals.

12. A control switch according to claim 10 including external control means for producing a controlled signal independent of said condition dependent signal and said reference signal, said switching means being connected with said external control means and intially latching into one of said modes during a given half cycle depending upon said controlled signal in conjunction with said condition dependent signal and reference signal.

13. A control switch according to claim 10 wherein said signal producing means include means for producing a third signal independent of said condition responsive signal and said reference signal and means for removably connecting said third signal producing means in circuit with said switching means whereby said switching means initially latches into one of said modes depending at least in part upon the amplitude ratio of said third signal compared to that of said reference signal.

14. A control switch arrangement, comprising:
(a) supply means for providing rectified AC voltage to a predetermined point;
(b) a gated unidirectional switching device connected to said predetermined point for closing a circuit from said point to a second point when said device is actuated; and
(c) a condition responsive control circuit connected with said supply means and including
(i) means for producing a first control signal having an amplitude ratio dependent upon said condition and a second reference signal having a fixed amplitude ratio,
(ii) switching means including a first transistor connected between said voltage supply means and the gate of said switching device for actuating said switching device into a state of conduction during conduction of said transistor, and circuit means including a second transistor connected with said voltage supply means for by-passing said gate when said second transistor is in a state of conduction, said transistors being interconnected with said signal producing means such that only one of said transistors latches into a state of conduction during any given half cycle, the particular transistor latching into conduction depending on the amplitude ratio of said control signal relative to that of said reference signal, said transistor initially latching into said state of conduction during said given half cycle at a voltage level below the peak voltage of said half cycle, and (iii) means for providing bias voltage across said transistors from said supply said voltage biasing means including first positive feedback means interconnecting said first transistor to said second transistor and second positive feedback means interconnecting said second transistor to said first transistor.

15. A control switch arrangement according to claim 14 including a charging capacitor connected with said predetermined point for producing a biasing voltage during said given half cycle, said voltage having a maximum amplitude dependent upon the number of times said switching device was in its activating or de-activating state over a plurality of half cycles immediately prior to said given half cycle, said biasing voltage being applied to one of said transistors for biasing the latter into a state of conduction or nonconduction depending upon its amplitude.

16. A control switch arrangement according to claim 14 wherein said control circuit includes means for causing said switching means to initially latch into one of said modes during any given half cycle only at a time during said half cycle when said voltage is rising, said last named means including a capacitor connected with said supply means and the base of said first transistor for providing a phase lead thereto.

17. A control switch arrangement according to claim 14 wherein said control circuit includes negative feedback means cooperating with said switching means and responsive to said condition dependent signal and said reference signal for varying the amount of time said switching means operates in either of said two modes, over a period of time, depending upon the difference between said signals.

18. A control switch arrangement according to claim 14 wherein said signal producing means includes thermal responsive means for producing said control signal.

19. A control switch arrangement, comprising:
(a) supply means for providing rectified AC voltage to a predetermined point;
(b) a switching device connected to said predetermined point for closing a circuit from said point to a second reference point when said switcing device is actuated;
(c) an external condition responsive control circuit including switching means connected with said supply means and said switching device and latching into one of two operating modes during a given half cycle of said rectified AC voltage, for either actuating said switching device or maintaining it in a deactuated state, depending upon the particular condition being monitored, said switching means initially latching into one of said modes during said given half cycle of said rectified AC voltage at a predetermined, fixed voltage level of said half cycle;
(d) means for producing a condition responsive signal having an amplitude ratio dependent upon said condition and a reference signal having a fixed amplitude ratio, said switching means being connected with said signal producing means and initially latching into one of said modes depending upon the amplitude ratio of said condition dependent signal relative to the amplitude ratio of said reference signal; and
(e) external control means for producing a controlled signal independent of said condition dependant signal and said reference signal, said switching means being connected with said external control means and initially latching into one of said modes during a given half cycle depending upon said controlled signal in conjunction with said condition dependent signal and reference signal.

20. A control switch arrangement, comprising:
(a) supply means for providing rectified AC voltage to a predetermined point;
(b) a switching device connected to said predetermined point for closing a circuit from said point to a second reference point when said switching device is actuated;
(c) an external condition responsive control circuit including switching means connected with said supply means and said switching device and latching into one of two operating modes during a given half cycle of said rectified AC voltage, for either actuating said switching device or maintaining it in a deactuated state, depending upon the particular condition being monitored, said switching means initially latching into one of said modes during said given half cycle of said rectified AC voltage at a predetermined, fixed voltage level of said half cycle; and
(d) means for producing a condition responsive signal having an amplitude ratio dependent upon said condition and a reference signal having a fixed amplitude ratio, said switching means being connected with said signal producing means and initially latching into one of said modes depending upon the amplitude ratio of said condition dependent signal relative to the amplitude ratio of said reference signal, said signal producing means including means for producing a third signal independent of said condition responsive signal and said reference signal and means for removably connecting said third signal producing means in circuit with said switching means whereby said switching means initially latches into one of said modes depending at least in part upon the amplitude ratio of said third signal compared to that of said reference signal.

21. A power control circuit, comprising:
(a) an AC voltage supply adapted to supply AC voltage to a load;
(b) a gated switching device adapted to pass current in at least one of two opposite directions, said switching device and load being connected across said voltage supply;
(c) a capacitor connected with said voltage supply so as to be charge thereby;
(d) a control circuit which includes means responsive to a predetermined external condition for producing a signal indicative thereof and which is connected with said voltage supply, said capacitor and the gate of said switching device for connecting said capacitor to said gate in response to said signal under said predetermined external condition whereby to initiate discharge of said capacitor into said gate for producing a sufficiently large current pulse to actuate said device and cause it to conduct during a given cycle of said voltage supply, said control circuit also including means for initiating discharge of said capacitor for causing said switching device to conduct only at a time during said given cycle when the voltage is moving away from zero;
(e) a resistor connected between said voltage supply and control circuit for reducing the voltage supply to the latter for operation thereof;
(f) means including a resistor and capacitor connected in series with one another between said voltage supply and control means for connecting said voltage supply to said control circuit in phase leading relationship compared to that of said switching device for causing said control circuit to initiate discharge of said capacitor for causing said switching device to conduct closer to zero voltage during said given cycle; and
(g) means for rectifying said AC voltage connecting said control circuit with said voltage supply whereby to provide rectified voltage to the control circuit from said supply, said rectifing means and said control circuit being connected between the discharge said of said capacitor and said switching device gate.

22. A control switching arrangement, comprising:
(a) supply means for providing rectified AC voltage to a predetermined point;
(b) a switching device connected to said predetermined point for closing a circuit from said point to a second reference point when said switching device is actuated; and
(c) an external condition responsive control circuit connected with said supply means and said switching device and operating in one of two operating modes during a given half cycle of said recitified AC voltage, for either actuating said switching device or maintaining it in a deactuated state, depending upon the particular condition being monitored, said control circuit including means for producing a mode biasing voltage during said given half cycle, said voltage having a maximum amplitude dependent upon the number of times said switching device was in its actuated or deactuated state over a plurality of half cycles immediately prior to said given half cycle whereby to bias said switching means towards one of said modes of operation depending upon the amplitude of said mode biasing voltage.

23. A control switch arrangement, comprising:
(a) supply means for providing rectified AC voltage to a predetermined point;
(b) a switching device connected to said predetermined point for closing a circuit from said point to a second reference point when said switching device is actuated;
(c) an external condition responsive control circuit connected with said supply means and said switching device and operating in one of two operating modes during a given half cycle of said rectified AC voltage, for either actuating said switching device or maintaining it in a deactuated state, depending upon the particular condition being monitored;
(d) means for producing a condition responsive signal having an amplitude ratio dependent upon said condition and a reference signal having a fixed amplitude ratio, said control circuit being connected with said signal producing means and operating into one of said modes depending upon the amplitude ratio of said condition dependent signal relative to the amplitude ratio of said reference signal; and (e) external control means for producing a controlled signal independent of said condition response signal and said reference signal, said control circuit being connected with said external control means and initially operating in one of said modes during a given half cycle depending upon said controlled signal in conjunction with said condition dependent signal and reference signal.

24. A control switch arrangement, comprising:
(a) supply means for providing rectified AC voltage to a predetermined point;
(b) a switching device connected to said predetermined point for closing a circuit from said point to a second reference point when said switching device is actuated;
(c) an external condition responsive control circuit connected with said supply means and said switching device and operating in one of two operating modes during a given half cycle of said rectified AC voltage, for either actuating said switching device or maintaining it in a deactuated state, depending upon the particular condition being monitored; and
(d) means for producing a condition responsive signal having an amplitude ratio dependent upon said condition and a reference signal having a fixed amplitude ratio, said control circuit being connected with said signal producing means and initially operating in one of said modes depending upon the amplitude ratio of said condition dependent signal relative to the amplitude ratio of said reference signal, said signal producing means including means for producing a third signal independent of said condition responsive signal and said reference signal and means for removably connecting said third signal producing means in circuit with said control circuit whereby said control circuit operates in one of said modes depending at least in part upon the amplitude ratio of said third signal compared to that of that of said reference signal.

* * * * *